(12) United States Patent
Hsu et al.

(10) Patent No.: US 7,038,928 B1
(45) Date of Patent: May 2, 2006

(54) METHOD OF DETERMINING OPTIMAL VOLTAGES FOR OPERATING TWO-SIDE NON-VOLATILE MEMORY AND THE OPERATING METHODS

(75) Inventors: Tzu-Hsuan Hsu, Hsinchu (TW); Ming-Hsiu Lee, Hsinchu (TW); Chao-I Wu, Hsinchu (TW); Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/991,537

(22) Filed: Nov. 17, 2004

(51) Int. Cl.
*G11C 17/00* (2006.01)
(52) U.S. Cl. .................. 365/104; 365/185.01
(58) Field of Classification Search .............. 365/104, 365/185.01
See application file for complete search history.

(56) References Cited

U.S. PATENT DOCUMENTS 6,438,027 B1 * 8/2002 Kwon .................. 365/185.03

* cited by examiner

*Primary Examiner*—Van Thu Nguyen
*Assistant Examiner*—Pho M. Luu
(74) *Attorney, Agent, or Firm*—J.C. Patents

(57) ABSTRACT

A method of determining an optimal reading voltage for reading a two-side non-volatile memory programmed with a threshold voltage Vt is described. A first side of a memory cell is programmed to Vt, and then an $I_1$-Vg curve of the first side and an $I_2$-Vg curve of the second side are measured, wherein Vg is the gate voltage. A $Gm_1$-Vg curve and a $Gm_2$-Vg curve are plotted, wherein $Gm_1 = dI_1/dVg$ and $Gm_2 = dI_2/dVg$. The optimal reading voltage $Vg_O$ is determined as the gate voltage at the intersection of $Gm_1$ and $Gm_2$, corresponding to a maximal total current window Wm ($= I_2(Vg_O) - I_1(Vg_O)$).

16 Claims, 4 Drawing Sheets

(a) Gm-Vg curve (right side programmed to 3V, left side not programmed)

(b) Corresponding W-Vg curve

METHOD OF DETERMINING OPTIMAL VOLTAGES FOR OPERATING TWO-SIDE NON-VOLATILE MEMORY AND THE OPERATING METHODS

BACKGROUND OF THE INVENTION

1. Field of the Invention

The present invention relates to operation of two-side non-volatile memory devices. More particularly, the present invention relates to a method of determining an optimal reading voltage for a specific threshold voltage, or an optimal combination of threshold voltage and reading voltage, that can maximize the total current window in reading. The present invention also relates to programming and reading methods of two-side non-volatile memory, which are based on the optimal reading voltage or the optimal combination of threshold voltage and reading voltage being determined.

2. Description of the Related Art

A two-side non-volatile memory cell, such as, a nitride read-only memory (NROM) cell, typically includes a storage layer and a gate stacked on a semiconductor substrate and source/drain regions in the substrate beside the gate. The storage layer has two storage sites at two sides thereof near the source/drain, wherein each site is programmed and read independently. In a two-side non-volatile memory storing one bit per side, a side is not programmed or is programmed to a threshold voltage (Vt). In a two-side non-volatile memory storing two or more bits per side, a side is not programmed, or is programmed to Vt or one of the intermediate states between the non-programmed state and the Vt state.

Currently, a two-side non-volatile memory is usually read in reverse direction. For example, when the right side of a memory cell is previously programmed with channel hot electron injection (CHEI) using a current from right to left, the reading current is from left to right. The difference between the reading current at the non-programmed state and that at the Vt state is called a total current window, which varies with the reading voltage applied to the gate. When each side of a memory cell stores two or more bits, the total current window is divided by several intermediate states.

To improve the reading accuracy, the total current window is preferably as wide as possible so that each storage state can be clearly distinguished from the others. Conventionally, the reading voltage is set as or beneath the threshold voltage, but the resulting total current window is often insufficient. Meanwhile, there is no method to determine the optimal reading voltage, which maximizes the total current window, for reading a two-side non-volatile memory programmed with a specific threshold voltage.

SUMMARY OF THE INVENTION

In view of the foregoing, this invention provides a method of determining an optimal reading voltage for reading a two-side non-volatile memory programmed with a specific threshold voltage.

Another object of this invention is to provide a method for operating a two-side non-volatile memory based on the optimal reading voltage being determined.

Yet another object of this invention is to provides a method of determining an optimal combination of threshold voltage and reading voltage for operating a two-side non-volatile memory.

Still another object of this invention is to provide a method for operating a two-side non-volatile memory based on the optimal combination of threshold voltage and reading voltage being determined.

The method of determining an optimal reading voltage for reading a two-side non-volatile memory programmed with a specific threshold voltage Vt of this invention is described as follows. A first side of a memory cell is programmed to Vt, and then an $I_1$-Vg curve of the first side and an $I_2$-Vg curve of the second side are measured, wherein Vg is the gate voltage. A $Gm_1$-Vg curve and a $Gm_2$-Vg curve are then plotted, wherein $Gm_1=dI_1/dVg$ and $Gm_2=dI_2/dVg$. The optimal reading voltage $Vg_O$ is determined as the gate voltage at the intersection of $Gm_1$ and $Gm_2$, corresponding to a maximal total current window Wm $(=I_2(Vg_O)-I_1(Vg_O))$.

According to the results of a series of experiments as described in the preferred embodiment of this invention, the optimal reading voltage $Vg_O$ is always higher than Vt. Meanwhile, any reading voltage (Vr) satisfying the inequality of "Vt<Vr≦$Vg_O$" makes a wider total current window Wr $(=I_2(Vr)-I_1(Vr))$, as compared with the prior art cases where reading voltage is set as Vt. In addition, when each side of a memory cell stores two or more bits, several intermediate states are set between the non-programmed state and the Vt state according to the total current window Wr. The two-side non-volatile memory is programmed according to the levels of the intermediate states and Vt.

Accordingly, the method for reading a two-side non-volatile memory of this invention includes the following steps. A reading voltage Vr satisfying the inequality "Vt<Vr≦$Vg_O$" is applied to the gate of a selected memory cell. The current of the first side of the selected memory cell is measured to determine the data value of the same, and the current of the second side is measured to determine the data value of the same.

The method for determining an optimal combination of threshold voltage and reading voltage, which can maximize the total current window, is described as follows. A series of $Vt_n$ (n=1, 2, . . . , M) is set first, and then the above method is used to determine an optimal reading voltage $Vg_{On}$ and a corresponding maximal total current window $Wm_n$ for each $Vt_n$. The largest one among the series of $Wm_n$ is determined as the globally maximal total current window $Wm_G$, and the corresponding threshold voltage $Vt_G$ and reading voltage $Vg_{OG}$ are the optimal combination of threshold voltage and reading voltage.

After the optimal combination of threshold voltage and reading voltage is determined, a two-side non-volatile memory can be programmed and read accordingly. When a memory cell stores one bit per side, each side is not programmed or is programmed to $Vt_G$. When a memory cell stores two or more bits per side, several intermediate states are set between the non-programmed state and the $Vt_G$ state, and each side is not programmed, or is programmed to $Vt_G$ or one of the intermediate states.

The steps for reading a two-side non-volatile memory programmed as above are described as follows. The globally optimal reading voltage $Vg_{OG}$ is applied to the gate of a selected memory cell. The current of the first side of the memory cell is measured to determine the data value of the same, and the current of the second side is measured to determine the data value of the same.

By using the optimal reading voltage for a specific threshold voltage or the optimal combination of threshold voltage and reading voltage being determined as above, the total current window can be maximized so that the difference between the current levels of two adjacent storage states is maximized. Consequently, the two-side non-volatile memory can be read with higher accuracy.

It is to be understood that both the foregoing general description and the following detailed description are exemplary, and are intended to provide further explanation of the invention as claimed.

DESCRIPTION OF THE PREFERRED EMBODIMENTS

Figure 1:
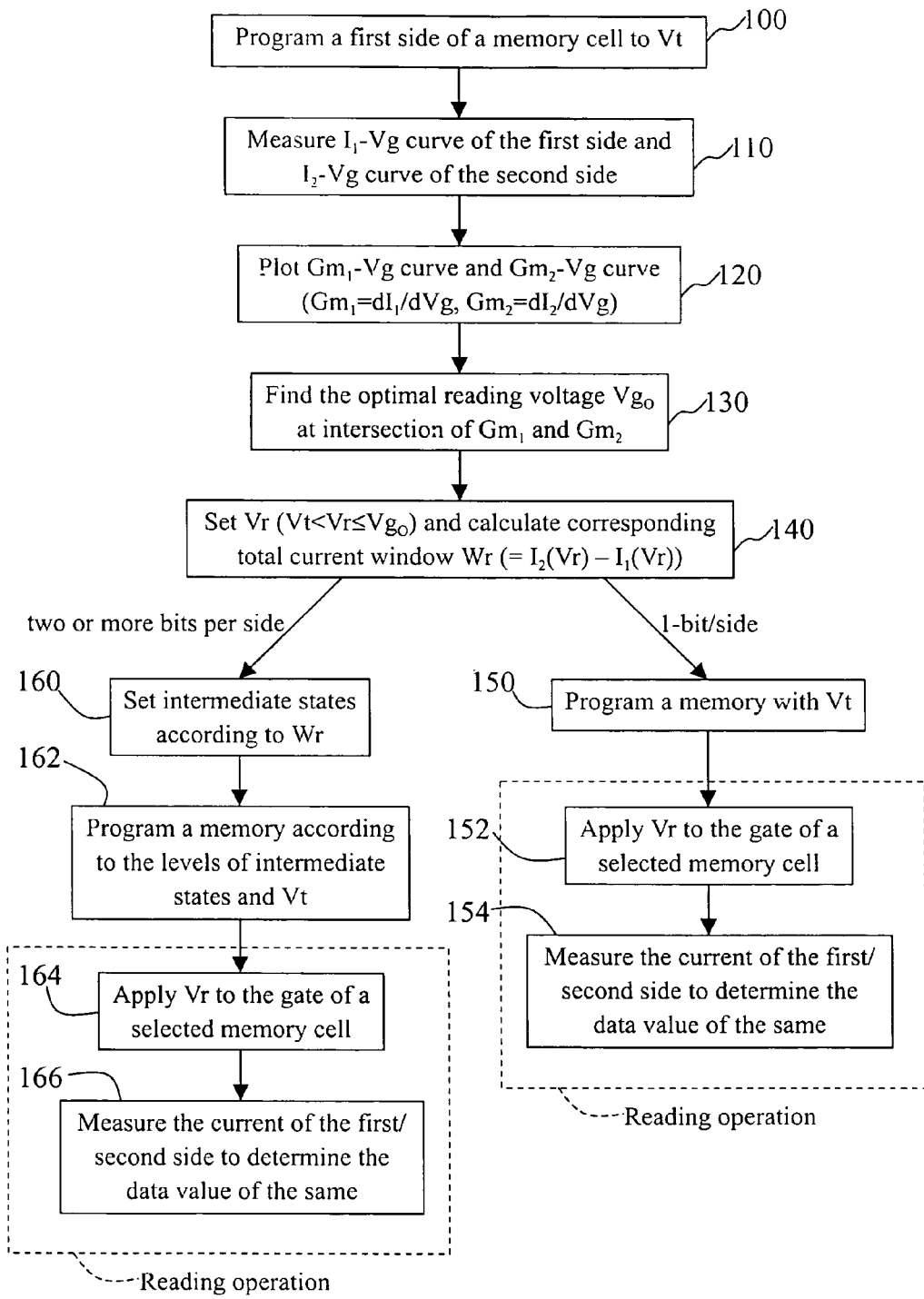
FIG. 1 shows a process flow of determining an optimal reading voltage for a specific threshold voltage and the corresponding operating methods according to a preferred embodiment of this invention.

Referring to FIG. 1, to determine an optimal reading voltage for a two-side non-volatile memory programmed with a specific threshold voltage Vt, a first side of a memory cell is programmed to Vt (step 100). The $I_1$-Vg curve of the first side and the $I_2$-Vg curve of the second side are then measured (step 110), wherein $I_1$ is defined as the reading current from the second side to the first side, and the direction of $I_2$ is reverse to that of $I_1$. A $Gm_1$-Vg curve and a $Gm_2$-Vg curve are then plotted (step 120), wherein $Gm_1 = dI_1/dVg$ and $Gm_2 = dI_2/dVg$. The intersection ($Vg_O$, $Gm_O$) of $Gm_1$ and $Gm_2$ is then determined (step 130), wherein $Vg_O$ is namely the optimal reading voltage for Vt. A reading voltage Vr satisfying the inequality "Vt<Vr≦$Vg_O$" is set, and the corresponding total current window Wr is calculated using the equation "Wr=$I_2$(Vr−$I_1$(Vr)" (step 140).

When a memory cell stores one bit per side, a side is not programmed or is programmed to Vt (step 150). In the method for reading such a memory, the reading voltage Vr (Vt<Vr≦$Vg_O$) set previously is applied to the gate of a selected memory cell (step 152). The current of the first side is then measured to determine the data value of the same, and the current of the second side is measured to determine the data value of the same (step 154). The determination of data value is based on the magnitude of the current referring to the value of the corresponding total current window Wr, which is defined as the difference between the current levels of the non-programmed state and the Vt state under the gate voltage Vr.

On the other hand, when a memory cell stores two or more bits per side, several ($2^n$−2, n≧2) intermediate states are set according to the value of Wr (step 160) after Wr is derived, and the memory is programmed according to the levels of the intermediate states and Vt (step 162). In a subsequent reading operation, the reading voltage Vr is applied to the gate of a selected memory cell (step 164). The current of the first side is measured to determine the data value of the same, and the current of the second side is measured to determine the data value of the same (step 166). The determination of data value is based on the magnitude of the current referring to the current levels of the intermediate states and the value of the corresponding total current window Wr as defined above.

Figure 2:
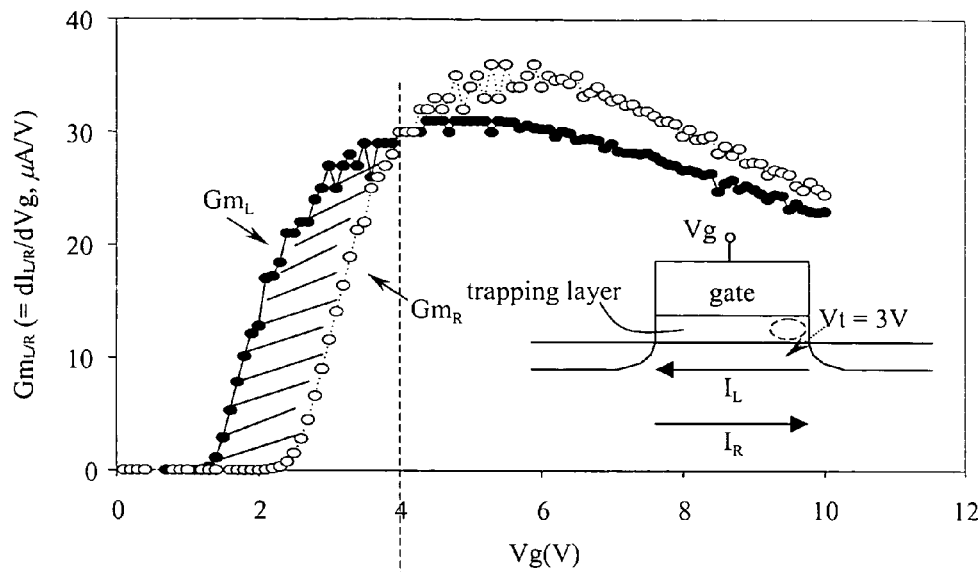
FIGS. 2(a)/(b) shows an example of the method of determining an optimal reading voltage for a two-side non-volatile memory programmed with a specific threshold voltage according to the preferred embodiment of this invention.
Figure 2:
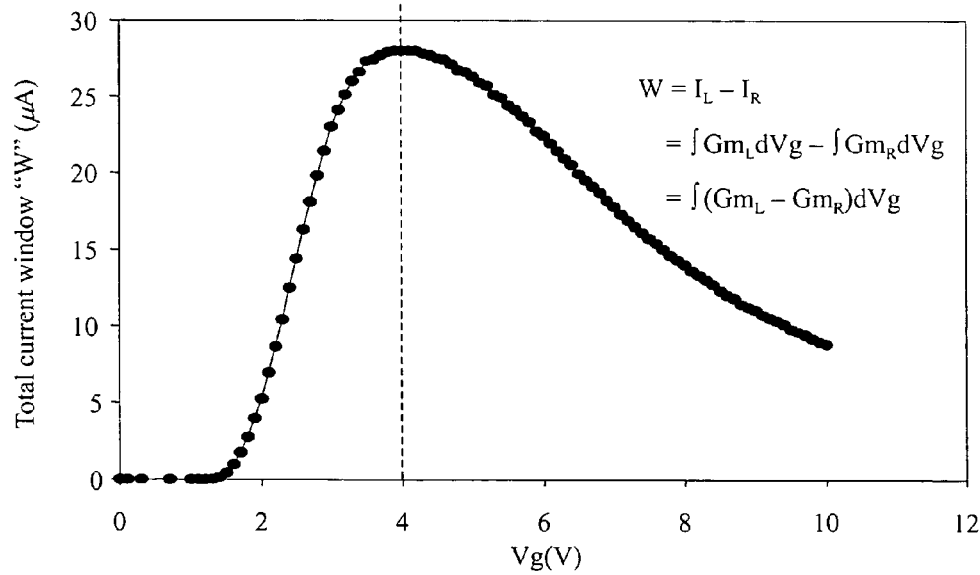

FIGS. 2(a)/(b) shows an example of the method of determining an optimal reading voltage for a two-side non-volatile memory programmed with a specific threshold voltage according to the preferred embodiment of this invention. The two-side non-volatile memory used in the experiment is a nitride read-only memory (NROM) having nitride trapping layers. However, the material of the trapping layer can alternatively be SiON, $HfO_2$, $Al_2O_3$ or any other dielectrics having numerous trapping sites, or a nano-crystal conductor.

Referring to FIGS. 2(a)/(b), the right side of the memory cell is programmed to 3V, but the left side is not programmed. The reading current $I_R$ of the right side, which is defined as the reading current from left to right, is then measured at different reading voltages (Vg). The reading current $I_L$ of the left side is also measured at different reading voltages.

The differential ($Gm_R$) of $I_R$ with respect to Vg ($Gm_R = dI_R/dVg$) and the differential ($Gm_L$) of $I_L$ with respect to Vg ($Gm_L = dI_L/dVg$) are then calculated and plotted in FIG. 2(a). As shown in FIG. (2a), the gate voltage at the intersection of $Gm_R$ and $Gm_L$ is 4V, which is higher than Vt (3V) and exactly corresponds to the maximum of the total current window "W", as indicated by the W-Vg curve plotted in FIG. 2(b) and the dashed line. In addition, the total current window "W" at any gate voltage "Vg" can be calculated by the following equation.

$$W = I_L - I_R = \int Gm_L dVg - \int Gm_R dVg = \int (Gm_L - Gm_R) dVg$$

Accordingly, the maximum of the total current window is equal to the area between the $Gm_L$-Vg curve and the $Gm_R$-Vg curve before the intersection of $Gm_L$ and $Gm_R$.

Figure 3:
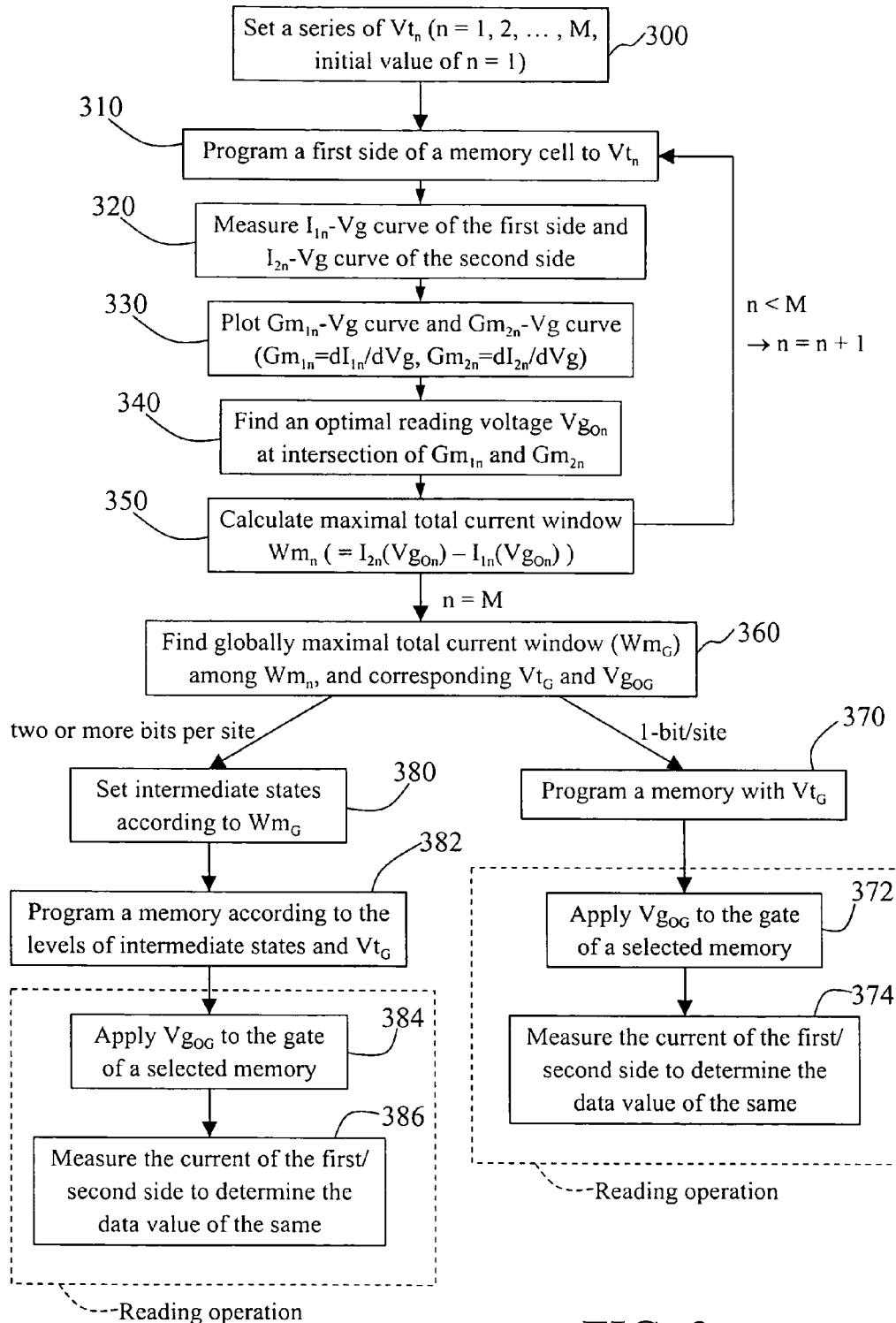
FIG. 3 shows a process flow of determining an optimal combination of threshold voltage and reading voltage for a two-side non-volatile memory and the corresponding operating methods according to the preferred embodiment of this invention.

Referring to FIG. 3, to determine an optimal combination of threshold voltage and reading voltage for operating a two-side non-volatile memory, a series of threshold voltage $Vt_n$ (n=1, 2, ..., M) is set in step 300, wherein one threshold voltage among the series of $Vt_n$ will be selected as an optimal threshold voltage $Vt_G$ latter. Thereafter, steps 310–350 are repeated until the optimal reading voltage $Vg_{On}$ and the corresponding maximal total current window $Wm_n$ for each $Vt_n$ are determined, wherein the initial value of n is 1 and the value of n is increased by 1 before each repetition. Steps 310–350 are described in details as follows.

In step 310, a first side of a memory cell is programmed to $Vt_n$, but the second side of the same memory cell is not programmed. In step 320, an $I_{1n}$-Vg curve of the first side and an $I_{2n}$-Vg curve of the second side are measured, wherein Vg is the gate voltage applied to the gate, and $I_{1n}$ is defined as the reading current from the second side to the first side and $I_{2n}$ as the reading current in the reverse direction. In step 330, a $Gm_{1n}$-Vg curve and a $Gm_{2n}$-Vg curve are plotted from the $I_{1n}$-Vg curve and the $I_{2n}$-Vg curve, wherein $Gm_{1n} = dI_{1n}/dVg$ and $Gm_{2n} = dI_{2n}/dVg$. In step 340, the intersection ($Vg_{On}$, $Gm_{On}$) of $Gm_{1n}$ and $Gm_{2n}$ is determined, wherein $Vg_{On}$ is the optimal reading voltage corresponding to $Vt_n$. In step 350, the maximal total current window $Wm_n$ corresponding to $Vt_n$ is calculated according to the following equation.

$$Wm_n = I_{2n}(Vg_{On}) - I_{1n}(Vg_{On})$$

After a series of $Wm_n$ is obtained as above, the globally maximal total current window ($Wm_G$) among the series of $Wm_n$ is determined, while the corresponding $Vt_G$ and $Vg_{OG}$ are the optimal combination of threshold voltage and reading voltage (step 360).

When a memory cell stores one bit per side, a side is either not programmed or programmed to $Vt_G$ (step 370). In the method for reading such a memory, the globally optimal reading voltage $Vg_{OG}$ is applied to the gate of a selected memory cell (step 372). The current of the first side is then measured to determine the data value of the same, and the current of the second side is measured to determine the data value of the same (step 374). The determination of data value is based on the magnitude of the current referring to the value of the globally maximal total current window $Wm_G$, which is defined as the difference between the current levels of the non-programmed state and the $Vt_G$ state under the gate voltage $Vg_{OG}$.

On the other hand, when a memory cell stores two or more bits per side, intermediate states are set according to the value of $Wm_G$ (step 380) after $Wm_G$ is determined, and then the memory is programmed according to the levels of the intermediate states and $Vt_G$ (step 382). In a subsequent reading operation, the globally optimal reading voltage $Vg_{OG}$ is applied to the gate of a selected memory cell (step 384). The current of the first side is measured to determine the data value of the same, and the current of the second side is measured to determine the data value of the same (step 386).

Figure 4:
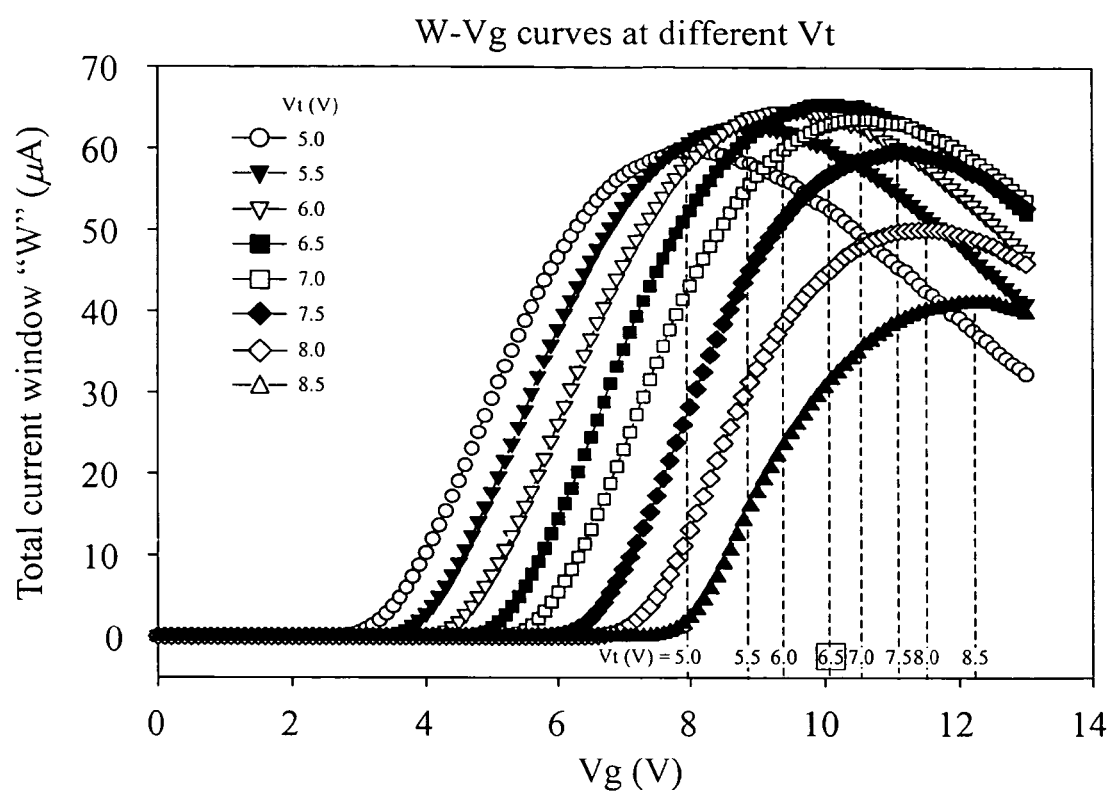
FIG. 4 shows an example of the method of determining an optimal combination of threshold voltage and reading voltage for a two-side non-volatile memory according to the preferred embodiment of this invention.

FIG. 4 shows an example of the method of determining an optimal combination of threshold voltage and reading voltage for operating a two-side non-volatile memory according to the preferred embodiment of this invention. In this example, several NROM cells are programmed to 5.0V, 5.5V, 6.0V, 6.5V, 7.0V, 7.5V, 8.0V and 8.5V, respectively, at only one side thereof, and the variation of total current window with respect to gate voltage "Vg" is derived as above for each different memory cell. Referring to FIG. 4, it is noted that the optimal reading voltage maximizing the total current window for a specific threshold voltage (Vt) is always higher than Vt, as indicated by the corresponding dashed line. In addition, a threshold voltage of 6.5V and a reading voltage of 10.1V are the optimal combination of threshold voltage and reading voltage that is capable of making a globally maximal total current voltage in a reading operation of the NROM.

By using the optimal reading voltage for a specific threshold voltage or the optimal combination of threshold voltage and reading voltage being determined as above, the total current window can be maximized. Therefore, the difference between the current levels of two adjacent storage states can be maximized to improve the reading accuracy. In addition, though the above experiments use a NROM as an example, this invention can also be applied to the operation of any other type of two-side non-volatile memory like PHINES memory, OTP memory, MTP memory, EPROM, EEPROM or Flash memory.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of determining an optimal reading voltage for reading a two-sided non-volatile memory programmed with a threshold voltage Vt, comprising:
   programming a first side of a memory cell to Vt;
   measuring an $I_1$-Vg curve of the first side and an $I_2$-Vg curve of a second side of the memory cell, wherein Vg is a voltage applied to a gate of the memory cell;
   plotting a $Gm_1$-Vg curve and a $Gm_2$-Vg curve from the $I_1$-Vg curve and the $I_2$-Vg curve, wherein $Gm_1=dI_1/dVg$ and $Gm_2=dI_2/dVg$; and
   determining the optimal reading voltage $Vg_O$ as the voltage at an intersection of the $Gm_1$-Vg curve and the $Gm_2$-Vg curve.

2. The method of claim 1, wherein the two-sided non-volatile memory comprises a non-volatile memory including trapping layers for non-volatile storage, and a material of the trapping layers is SiN, SiON, $HfO_2$, $Al_2O_3$ or a nano-crystal conductor.

3. The method of claim 2, wherein the two-sided non-volatile memory comprises a nitride read-only memory (NROM).

4. A method for operating a two-side non-volatile memory, comprising:
   programming the two-side non-volatile memory with a threshold voltage Vt;
   applying a reading voltage Vr higher than Vt to a gate of a selected memory cell; and
   measuring a first current of a first side of the selected memory cell to determine a first data value of the first side, and measuring a second current of a second side of the selected memory cell to determine a second data value of the second side,
   wherein the reading voltage Vr is lower than or equal to an optimal reading voltage $Vg_O$, and the optimal reading voltage $Vg_O$ is determined with steps comprising:
   programming a first side of a memory cell to Vt;
   measuring an $I_1$-Vg curve of the first side and an $I_2$-Vg curve of a second side of the memory cell, wherein Vg is a voltage applied to a gate of the memory cell;
   plotting a $Gm_1$-Vg curve and a $Gm_2$-Vg curve from the $I_1$-Vg curve and the $I_2$-Vg curve, wherein $Gm_1=dI_1/dVg$ and $Gm_2=dI_2/dVg$; and
   determining the optimal reading voltage $Vg_O$ as the voltage at an intersection of the $Gm_1$-Vg curve and the $Gm_2$-Vg curve.

5. The method of claim 4, wherein each of a plurality of memory cells of the two-side non-volatile memory stores one bit per side, and each side of the memory cell is not programmed or is programmed to Vt.

6. The method of claim 4, wherein each of a plurality of memory cells of the two-side non-volatile memory stores two or more bits per side, the method further comprising the following steps before the non-volatile memory is programmed:
   calculating a total current window (Wr) corresponding to the reading voltage Vr by using the equation "$Wr=I_2(Vr)-I_1(Vr)$"; and
   setting a plurality of intermediate states between a non-programmed state and a Vt state according to the value of Wr, while the two-side non-volatile memory is programmed according to levels of the intermediate states and Vt.

7. The method of claim 4, wherein the two-sided non-volatile memory comprises a non-volatile memory including trapping layers for non-volatile storage, and a material of the trapping layers is SiN, SiON, $HfO_2$, $Al_2O_3$ or a nano-crystal conductor.

8. The method of claim 7, wherein the two-sided non-volatile memory comprises a nitride read-only memory (NROM).

9. A method for determining an optimal combination of threshold voltage and reading voltage for operating a two-side non-volatile memory, comprising:

(a) setting a series of $Vt_n$ (n=1, 2, ..., M, initial value of n=1);

(b) programming a first side of a memory cell to $Vt_n$;

(c) measuring an $I_{1n}$-Vg curve of the first side and an $I_{2n}$-Vg curve of a second side of the memory cell, wherein Vg is a voltage applied to a gate of the memory cell;

(d) plotting a $Gm_{1n}$-Vg curve and a $Gm_{2n}$-Vg curve from the $I_{1n}$-Vg curve and the $I_{2n}$-Vg curve, wherein $Gm_{1n}=dI_{1n}/dVg$ and $Gm_{2n}=dI_{2n}/dVg$;

(e) determining an optimal reading voltage $Vg_{On}$ corresponding to $Vt_n$ as the voltage at an intersection of the $Gm_{1n}$-Vg curve and the $Gm_{2n}$-Vg curve;

(f) calculating a maximal total current window $Wm_n$ (=$I_{2n}(Vg_{On})-I_{1n}(Vg_{On})$) corresponding to $Vt_n$;

cyclically repeating the above steps (b)–(f), with the value of "n" being increased by 1 before each repetition, until $Wm_M$ is obtained, so as to obtain a series of $Vg_{On}$ and a series of $Wm_n$ corresponding to the series of $Vt_n$(n=1, 2, ..., M); and determining a globally maximal total current window $Wm_G$ among the series of $Wm_n$, while the threshold voltage $Vt_G$ and the optimal reading voltage $Vg_{OG}$ corresponding to $Wm_G$ is the optimal combination of threshold voltage and reading voltage.

10. The method of claim 9, wherein the two-sided non-volatile memory comprises a non-volatile memory including trapping layers for non-volatile storage, and a material of the trapping layers is SiN, SiON, $HfO_2$, $Al_2O_3$ or a nano-crystal conductor.

11. The method of claim 10, wherein the two-sided non-volatile memory comprises a nitride read-only memory (NROM).

12. A method for operating a two-side non-volatile memory, comprising:

determining an optimal combination of a threshold voltage and a reading voltage for the two-side non-volatile memory;

programming the two-side non-volatile memory with the threshold voltage;

applying the reading voltage to a gate of a selected memory cell; and measuring a first current of a first side of the selected memory cell to determine a first data value of the first side, and measuring a second current of a second side of the selected memory cell to determine a second data value of the second side, wherein the optimal combination of threshold voltage and reading voltage is determined by steps comprising:

(a) setting a series of $Vt_n$(n=1, 2, ..., M, initial value of n=1);

(b) programming a first side of a memory cell to $Vt_n$;

(c) measuring an $I_{1n}$-Vg curve of the first side and an $I_{2n}$-Vg curve of a second side of the memory cell, wherein Vg is a voltage applied to a gate of the memory cell;

(d) plotting a $Gm_{1n}$-Vg curve and a $Gm_{2n}$-Vg curve from the $I_{1n}$-Vg curve and the $I_{2n}$-Vg curve, wherein $Gm_{1n}=dI_{1n}/dVg$ and $Gm_{2n}=dI_{2n}/dVg$;

(e) determining an optimal reading voltage $Vg_{On}$ corresponding to $Vt_n$ as the voltage at an intersection of the $Gm_{1n}$-Vg curve and the $Gm_{2n}$-Vg curve;

(f) calculating a maximal total current window $Wm_n$ corresponding to $Vt_n$ by using the equation "$Wm_n=I_{2n}(Vg_{On})-I_{1n}(Vg_{On})$";

cyclically repeating the above steps (b)–(f), with the value of "n" being increased by 1 before each repetition, until $Wm_M$ is obtained, so as to obtain a series of $Vg_{On}$ and a series of $Wm_n$ corresponding to the series of $Vt_n$ (n=1, 2, ..., M); and determining a globally maximal total current window $Wm_G$ among the series of $Wm_n$, while the threshold voltage $Vt_G$ and the optimal reading voltage $Vg_{OG}$ corresponding to $Wm_G$ is the optimal combination of threshold voltage and reading voltage.

13. The method of claim 12, wherein each of a plurality of memory cells of the two-side non-volatile memory stores one bit per side, and each side of the memory cell is not programmed or is programmed to $Vt_G$.

14. The method of claim 12, wherein each of a plurality of memory cells of the two-side non-volatile memory stores two or more bits per side, the method further comprising the following step before the non-volatile memory is programmed:

setting a plurality of intermediate states between a non-programmed state and a $Vt_G$ state according to the value of $Wm_G$, while the two-side non-volatile memory is programmed according to levels of the intermediate states and $Vt_G$.

15. The method of claim 12, wherein the two-sided non-volatile memory comprises a non-volatile memory including trapping layers for non-volatile storage, and a material of the trapping layers is SiN, SiON, $HfO_2$, $Al_2O_3$ or a nano-crystal conductor.

16. The method of claim 15, wherein the two-sided non-volatile memory comprises a nitride read-only memory (NROM).

* * * * *